June 25, 1968 E. P. HABDAS 3,390,018

THERMOELECTRIC HEAT PUMP AND HEAT FLOW PEGS

Filed April 15, 1963 2 Sheets-Sheet 1

INVENTOR.
EDWARD P. HABDAS

THERMOELECTRIC HEAT PUMP AND HEAT FLOW PEGS

Filed April 15, 1963 2 Sheets-Sheet 2

INVENTOR.
EDWARD P. HABDAS

United States Patent Office 3,390,018

Patented June 25, 1968

3,390,018

THERMOELECTRIC HEAT PUMP AND HEAT FLOW PEGS

Edward P. Habdas, Dearborn, Mich., assignor to Calumet & Hecla, Inc., Allen Park, Mich., a corporation of Michigan Filed Apr. 15, 1963, Ser. No. 272,888

22 Claims. (Cl. 136—204)

The present invention relates to peg-type heat exchangers for thermoelectric devices and the method of making the same.

In general terms, the thermoelectric device to which the present invention applies comprises an assembly of semi-conductor elements, referred to as pellets, arranged in an electrically and thermally insulating supporting matrix, and forming a flat self-supporting body referred to herein as a module. The pellets are typically short cylindrical bodies having flat end surfaces and are disposed in an array in which N-type and P-type are alternated and are positioned with their axes parallel, and with flat end surfaces exposed at opposite sides of said module. Adjacent ends of N and P type pellets are electrically connected, forming a couple having a junction which, upon the passage of electric current, produces the Peltier effect thereat. The arrangement is such that all hot junctions are disposed at one side of the module and all cold junctions at the other side.

The problem of transferring heat from the junction of a thermoelectric couple has several aspects which make it unique from other applications of heat transfer. First of all, the rate of heat generated or absorbed at a junction is equal to $\pi I$, where $\pi$ is the Peltier coefficient and I the junction current. This relationship does not directly involve the area of the junction; however, the total junction area perpendicular to the heat flux is directly proportional to the semi-conductor pellet length for a given heat load. Since the volume of semi-conductor material for a given heat load is proportional to the semi-conductor length squared, it is desirable from a material cost savings standpoint to use the minimum length possible consistent with other considerations. Thus, a savings of this relatively expensive semi-conductor material by pellet length reduction is accompanied by an increase in heat flux density across the junction area.

This factor when considered with another aspect of thermoelectric devices; that is, the desirability of electrically insulating the couple junction from its heat exchanger, results in a problem of transferring large quantities of heat across relatively small junction areas with a minimum of temperature differential across the electrical insulation.

With regard to transfer of heat to a junction (air side-air conditioner), some of the major considerations are as follows:

(1) There must be the ability to provide maximum fin area in contact with the air stream.

(2) The pressure drop across such fins should be a minimum consistent with desired heat transfer.

(3) Provision should be made for inherent condensate removal so that flooding of the fins cannot occur.

(4) An electrical insulation is required between the junction and fin mounting means in order to allow the fins to be at ground potential and to prevent shorting of the junctions. This electrical barrier inherently also becomes a thermal barrier and at very high Q rates results in a significant temperature difference between the junction and the fin mounting means. This should be minimized.

The present invention is concerned primarily with providing, in a thermoelectric device, a substantially increased area of electrical insulation for a given heat flux and junction area over conventional assembly techniques.

It is an object of this invention to provide an improved method of providing an extremely tight and mechanicaly reliable bond between the junction material, electrical insulation, and heat transfer surface without the use of adhesive materials.

It is a further object of this invention to provide a type of heat transfer surface with which the exposed surface area can be easily varied to provide the optimum amount for different situations.

It is a further object of the present invention to provide an improved heat exchanger characterized by a relatively large cross-sectional area of electrical insulating material through which the heat flux passes, resulting in a reduced temperature differential across this thermal barrier.

It is a further object of the present invention to provide an improved heat exchanger comprising an elongated metal peg or rod having a metal tubular sheath surrounding the peg or rod and an interposed layer of electrically insulating and thermally conducting material in intimate surface-to-surface contact with both the peg or rod and the sheath.

It is a further object of the present invention to provide a heat exchanger as described in the preceding paragraph in which the interposed layer is a metal oxide, preferably aluminum or magnesium oxide.

It is a further object of the present invention to provide a method for securely holding the electrical insulation in the proper location without the use of additional adhesive materials such as resins and holding in such a way that it is relatively unaffected by shock or vibration.

It is a further object of the present invention to provide a heat exchanger comprising a plurality of peg-type elements as described in the preceding paragraphs, provided with fin structure secured to the sheaths.

It is a further object of the present invention to provide a heat exchanger as described in the preceding paragraph in which the fin structure comprises a plurality of substantially parallel metal sheets each of which is in good heat conducting relation to all of the peg-type units.

It is a further object of the present invention to provide an improved method of making peg-type heat exchange units which comprises providing finely powdered metallic oxide between the outer surface of a metal rod and the inner surface of a metal tube surrounding the rod, and thereafter reducing the tube to bring about continuous surface contact between the metallic oxide and the adjacent surfaces of the rod and tube.

It is a further object of the present invention to provide a method of making peg-type heat exchange units as described in the preceding paragraph in which the tube is reduced by swaging or by magnetic forming.

It is a further object of the present invention to provide an improved method of making a peg-type heat exchange element which comprises forming a continuous layer of metallic oxide on the lateral surface of a rod by thermal evaporation, sputtering or anodizing and thereafter inserting the coated rod into a tube and reducing the tube into firm surface-to-surface contact with the coated rod.

It is a further object of the present invention to provide a peg-type heat exchange assembly characterized by improved drainage of condensate and improved air circulation for heat transfer.

Other objects and features of the invention will become apparent as the description proceeds, especially when taken in conjunction with the accompanying drawings, illustrating preferred embodiments of the invention, wherein.

Figure 1:
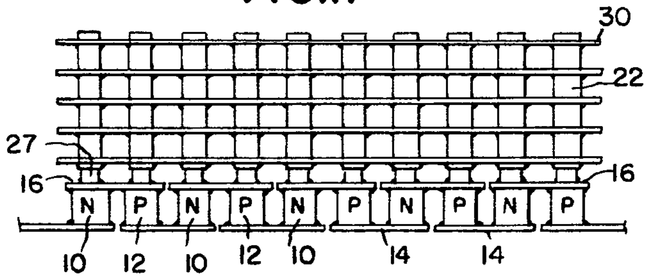
FIGURE 1 is a side elevation of a thermoelectric heat pump module provided with the improved peg-type heat exchanger.

Referring first to FIGURE 1 is illustrated a thermoelectric heat pump module of known type provided with the improved peg-type heat exchanger disclosed herein. The thermoelectric heat pump module comprises a plurality of semi-conductor pellets, alternate pellets as indicated at 10 being of N type as indicated in the figure, and the remaining alternate pellets 12 being of P type. Bottom electrical connectors 14 and top electrical connectors 16 are provided, the connectors 14 and 16 connecting different pairs of pellets so that a continuous electrical circuit is provided in which all of the pellets are connected in series. Preferably, the connectors 14 and 16 are formed of copper.

In accordance with well understood principles, when an electric current is passed in one direction through the assembly of pellets, corresponding ends of all pellets, as for example the upper ends in FIGURE 1, are cooled, whereas the lower ends of the pellets are heated by the Peltier effect.

In order to make a practical use of the cooling effect at the upper ends of the semi-conductor pellets, it is essential to provide for heat transfer in an efficient manner. In the past this has been accomplished by providing a so-called "heat-sink" which essentially comprised a continuous metal plate connected through a continuous electrically insulating sheet to the connectors 16 interconnecting the upper ends of adjacent pellets. A continuous aluminum oxide layer has been employed and the heat-sink has been formed of a copper or aluminum plate provided with a multiplicity of parallel sheet-like fins.

In accordance with the present invention, heat exchange pegs are provided and these pegs may be individually related to each semi-conductor pellet 10 or 12, as shown in FIGURE 1. It is preferable however, to utilize a peg with a transverse elongation as will be subsequently described in detail in connection with FIGURES 8–10, so as to be associated with a pair of such pellets. This elongated peg provides these additional advantages over the individually related pegs: Two solder joints are eliminated per couple junction since the pellets 10 and 12 are soldered directly to a single central peg; the connector resistance is reduced since a relatively thin connector is replaced by one with greatly increased thickness; the cross-sectional area of one elongated peg perpendicular to the direction of heat flow is greater than the area of two circular cross-section pegs, thus increasing thermal conductance.

Figure 4:
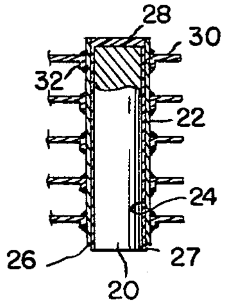
FIGURE 4 is an enlarged fragmentary section on the line 4—4, FIGURE 2.

Referring now to FIGURE 4, one of the heat exchange pegs is illustrated as comprising an inner peg or rod 20 which may be cylindrical as shown, or which may be oval or rectangular with radiused or semi-circular ends. Surrounding the peg 20 is a metal sheath 22 and interposed between the sheath 22 and the peg 20 is an extremely thin layer of electrically insulating material 24. Conveniently, the peg 20 may be formed of aluminum or copper. The sheath 22 may likewise be formed of aluminum or copper. The insulating layer 24 is a material selected because of its efficient electrical insulation properties and its ability to transmit heat. Metal oxides have been found particularly useful and good results have been obtained employing oxides of aluminum, titanium, silicon, magnesium and zirconium. The insulating layer must be perfectly continuous so as to constitute an effective insulator and it is as thin as possible while preserving its integrity. Where the layer is provided in the form of a finely powered oxide, the thickness of the layer is as small as possible. Excellent results have been obtained where the peg unit is formed from an aluminum rod which is hard anodized to provide a tightly adhered film or coating of aluminum oxide having a thickness of between .0005 and .0030 inch. This film provides efficient electrical insulation and offers a minimum of resistance to heat flow therethrough. Moreover, it lends itself to an operation in which the tubular sheath is most effectively interconnected therewith. Since the anodized film or coating is in effect a permanent integral portion of the aluminum rod, it is possible to provide a tubular metal sheath over the anodized rod and thereafter by drawing, roll reducing, magnetic forming or otherwise to reduce the diameter of the tubular sheath so that it is in firm intimate contact with the aluminum oxide layer. In the case of the hard coat anodized rod it is not desirable to reduce its diameter as the anodized coating is relatively hard and brittle, and will crack if subjected to elongation or reduction. The cracks become points of possible electrical breakdown.

Still another way of providing thin layers of the metallic oxide insulating material may be by thermal evaporation or sputtering techniques.

Figure 3:
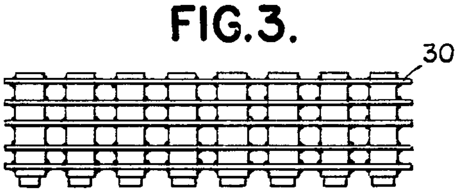
FIGURE 3 is a side elevational view of the heat exchanger shown in FIGURE 2.

The lower end of the sheath is caused to terminate slightly above the bottom end of the peg as indicated at 26, so as to leave the lower portion 27 of the peg exposed, and thus to permit attachment of the peg by soldering or the like to one or more semi-conductor pellets without completing an electrical circuit to the insulated sheath. The opposite end of the peg assembly is preferably sealed, as for example by a plastic plug 28. The metal sheath 22 has firmly attached thereto heat exchange fins 30. As best seen in FIGURE 3, the heat exchange fins 30 are preferably in the form of relatively large continuous sheets having openings therein in which the peg assemblies are received.

Figure 4A:
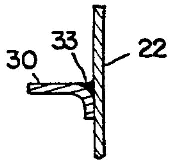
FIGURE 4A is an enlarged fragmentary sectional view illustrating a modified fin connection.

Referring again to FIGURE 4, it will be observed that the openings in the sheets 30 include laterally extending flanges 32 to provide for increased area contact with the sheath so as to facilitate heat transfer to the fins. This same effect may be achieved by slightly indenting the sheets at the peg openings so that a fillet of solder or brazing material will result between the sheet 30 and metal sheath 22, as shown at 33 in FIGURE 4A.

Referring again to FIGURE 1, the manner of attaching the peg-type heat exchanger to the terminal electric heat pump module is clearly illustrated. The bottom projecting end portion 27 of each peg is soldered directly to one of the copper connectors 16. With this arrangement it is of course apparent that the electrical circuit through the pellets 10 and 12 is as before, since the metal sheaths 22 surrounding the peg 20 are electrically insulated therefrom. On the other hand, there is a relatively great area of extremely thin electrically insulating and heat conducting material interposed between the pegs 20 and the sheaths 22 so that efficient transfer of heat to the sheaths 22 and thence to the fins 30 is effected.

In producing the individual heat peg assemblies, best illustrated in FIGURE 4, the tubular sheath 22 is provided over the elongated peg or rod 20 with substantial clearance space therebetween. This clearance space is then filled with powered electrical insulating material such for example as aluminum or magnesium oxide. Thereafter, the sheath is reduced in diameter by swaging, drawing, roll reducing or magnetic forming. With this operation the metallic oxide becomes a rock-like film which may be of a thickness as small as .001 inch. The sheathed rod is then cut to required length and the sheath at one end is stripped about approximately 3/32 to 1/8 inch as illustrated at 26 in FIGURE 4.

Great care must be exercised to provide a perfectly continuous layer or film of the metallic oxide. In accordance with one embodiment of the present invention, this layer of metallic oxide may be provided on the rod as a continuous bonded film by thermal evaporation or sputtering. These techniques are well understood. Thermal evaporation of the metallic oxide may take place in a vacuum chamber through which the rod is advanced, preferably accompanied by rotation of the rod. Individual molecules of the particular metallic oxide deposit on the surface of the rod and become permanently bonded thereto. The layer of metallic oxide may be built up to any required thickness, but in general it is possible to provide perfectly continuous film having a thickness corresponding to one or a limited number of molecules. A similar technique is the application of the material by sputtering, in which larger particles of the metallic oxide are sputtered from an electrode and deposited on the rod, also in a vacuum chamber.

Metallic oxide films applied by thermal evaporation or sputtering are molecularly bonded to the rod and the rod may be provided with a tubular sheath after which the sheath may be reduced in diameter to provide perfectly firm continuous contact with the outer surface of the metallic oxide, preferably by an operation which results in a good contact by actually reducing the diameter of the assembly including the rod.

Figure 5:
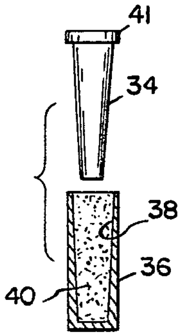
FIGURE 5 is an exploded view of a peg element and sheath therefor used in making the peg-type heat exchange element.
Figure 6:
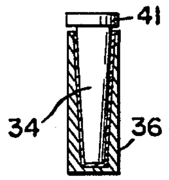
FIGURE 6 is a view of the peg and sheath after assembly.

An alternative method of providing the insulating layer of metallic oxide is illustrated in FIGURES 5 and 6 where the rod 34 and sheath 36 are initially provided with a slight corresponding taper. The taper in these elements may be provided by casting, cold extrusion, or machining. The cavity 38 within the sheath is filled or partly filled with finely powdered metallic oxide, preferably aluminum oxide or magnesium oxide as indicated at 40, and thereafter the tapered peg is pressed into the sheath as illustrated in FIGURE 6, under extremely high pressure. In this case the peg 34 is provided with a laterally enlarged head 41 which provides the exposed but insulated end of the peg assembly which may be soldered to the end of the conducting straps or connectors 16.

Figure 2:
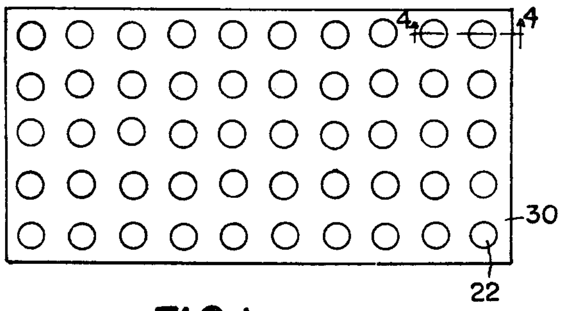
FIGURE 2 is a plan view of the heat exchanger shown in FIGURE 1, to a different scale.

Referring again to FIGURES 2–4, a preferred method of producing the assembly illustrated in FIGURE 3 will now be described. First, the individual rods 20 are inserted in the sheath tubes 22 with considerable clearance. The end of the tube is now swaged so that it will go through a properly sized draw die and the gap between the tube and rod is filled with powdered oxide such for example as aluminum or magnesium oxide. In order to provide complete filling of this relatively narrow space vibration will be employed. The end of the tube is now closed with a temporary plug and the assembly is drawn through a die on a drawbench in lengths of approximately 20 feet.

Following this, the next operation is a precision cutoff as by sawing and end treatment. The rod is cut into lengths of approximately two inches, after which approximately 1/8 inch of the outer sheath is stripped from one end and the rod is countersunk in the tube at the outer end to provide for the plastic sealing plug 28. This stripping operation of one end and countersinking of the other end may be replaced by one pressing operation which pushes the central peg down approximately 1/8 inch. This operation simultaneously provides for the exposed portion of peg 27 and plastic sealing 28.

The plates or fins 30 are formed from strip stock which is fed into a punch press provided with dies to punch the required number of holes, size the holes, form the flange portions 32, and shear the strip to the required length. Thereafter, the plates are stacked onto the assembly of pegs and spaced as required. Connection between the plates 30 and the sheath 22 will be by furnace brazing or soldering. As a final operation, the plastic resin 28 is provided in the countersunk end of the assembly to seal the metallic oxide against moisture or foreign matter.

Figures 8, 9, 9A, 10, 10A, 11, 12, 13, 14:
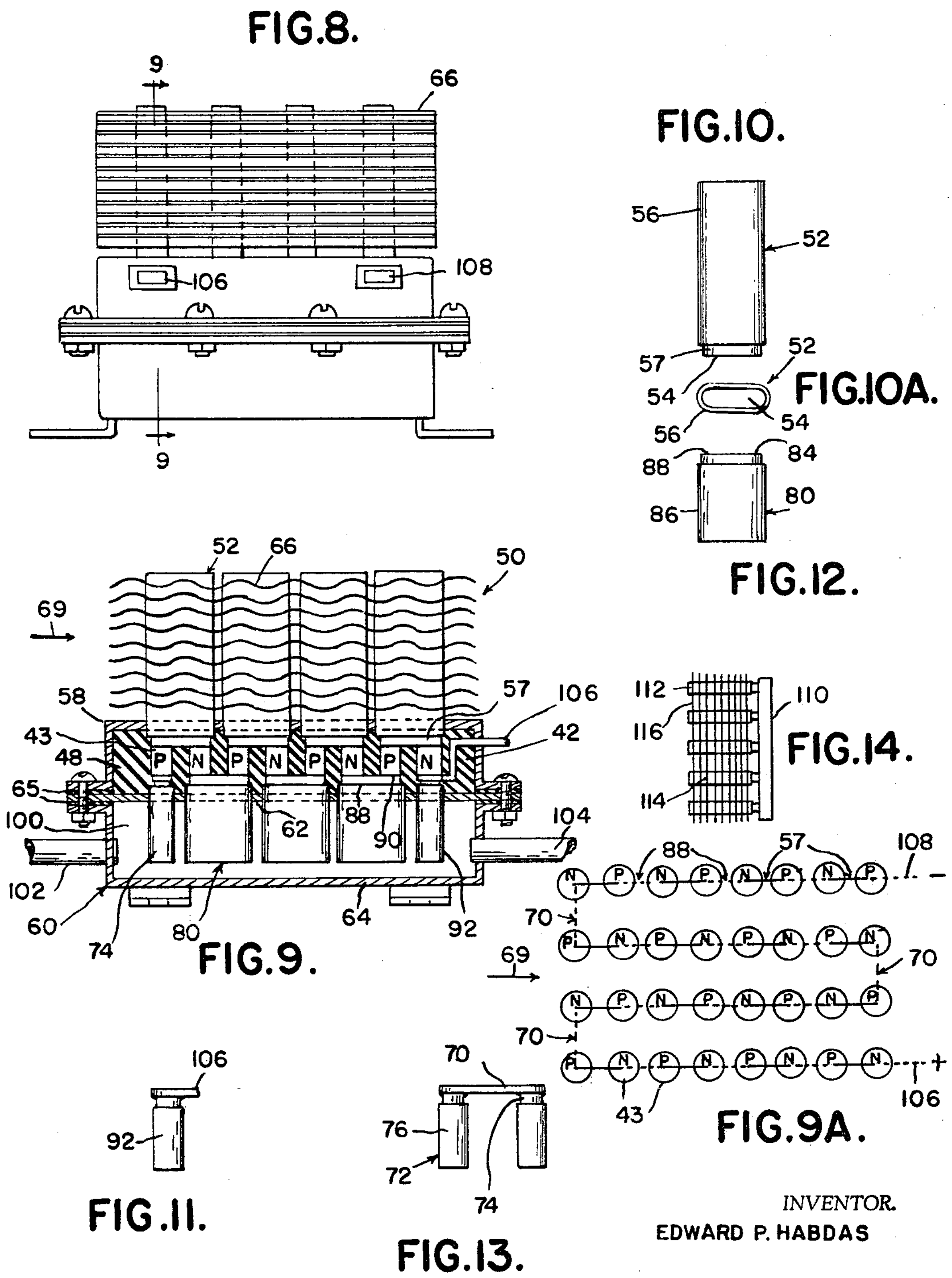
FIGURE 8 is a side elevation of a thermoelectric heat exchange device.
FIGURE 9 is a section on the line 9—9, FIGURE 8.
FIGURE 9A is a diagrammatic representation of the spacing and arrangement of semi-conductor pellets in the apparatus illustrated in FIGURES 8 and 9.
FIGURE 10 is a side elevation of a heat exchange peg used in the assembly of FIGURE 8.
FIGURE 10A is a bottom plan view of the peg shown in FIGURE 10.
FIGURE 11 is a side view of the differently shaped peg employed in the construction illustrated in FIGURE 8 on the two semi-conductor pellets into which the external power leads are attached.
FIGURE 12 is a side elevational view of the typical heat exchange pegs employed in the lower part of the construction shown in FIGURE 8.
FIGURE 13 is a side elevational view of the differently shaped peg employed in the lower part of the construction shown in FIGURE 8 as cross flow connector-heat exchanger links.
FIGURE 14 is a side elevational view illustrating a preferred positioning of the peg-type heat transfer surface.

Referring now to FIGURES 8–13 there is illustrated a thermoelectric heat pump assembly provided with the improved peg-type heat transfer unit. As seen in these figures, the thermoelectric heat pump module indicated generally at 42, comprises a multiplicity of N type and P type pellets 43 disposed in physical parallelism and electrically connected in series at the tops and bottoms thereof by connection to properly shaped and disposed pegs, or more particularly to the inner rod portions thereof. The semiconductor pellets 43 are assembled together in a suitable thermal insulation material 48 such as a foamed plastic which provides thermal insulation between the hot and cold sides of the module. In the illustrated embodiment, the semi-conductor terminals at the top are the cold terminals and the heat transfer assembly indicated generally at 50 is accordingly cooled and operates to cool air circulated therethrough. In this case heat transfer pegs of two different types are employed. The pegs 52 are of transversely elongated cross-section, as best illustrated in FIGURE 10A, and comprise the metal peg 54 and the sheath 56 insulated therefrom, the lower end of the peg 54 extending downwardly as indicated at 57. Each of the transversely elongated pegs 52 has the lower end 57 of its peg 54 soldered to a pair of semi-conducting pellets 43. The sheath 56 of each of these peg assemblies extends through an opening in the cover 58 of a housing assembly indicated generally at 60, which includes a partition 62 and a lower portion 64. Thermal insulation 65 is included between the cover 58, partition 62, and the lower portion 64 all around the flange to reduce the thermal conductance from the hot side to cold side of the module. The peg assemblies 52 are connected to fin structure or sheets indicated at 66 which have openings therethrough closely surrounding the sheaths 56 and which are soldered or brazed thereto in good heat transfer relationship. As indicated in FIGURE 9, the sheets 66 may conveniently be corrugated transversely of the direction of air flow so as to increase thermal efficiency.

Inasmuch as the pellets 43 are arranged in a block, as best illustrated in FIGURE 9A, including a number of pellets extending from left to right as seen in FIGURE 9, and also extending from front to rear, it is essential in order to provide the requisite electrical series relationship, to have some of the end pairs of pellets connected by conductors 70 which extend crossways to the direction of flow of fluid designated by the arrow 69. For this purpose the peg assembly of FIGURE 13 is employed, and comprises an electrical conductor strap 70 connected to the upper portions of a pair of pegs 72. Pegs 72 comprise inner rods 74, and insulated sheaths 76 surrounding the rods. It is advantageous to reduce the electrical resistance to a minimum so that the $I^2R$ heating be minimized. For this reason conductor straps between pellets are held to a minimum length. While this is easily achieved with the proposed construction for the electrical circuit parallel to the air flow 69, the crosswise connectors must necessarily be longer. This disadvantage is overcome by providing an electrical circuitry which provides for all the crosswise connectors to occur at the hot side of the module or, as shown in FIGURE 9, at the water side. By this means the small amount of added $I^2R$ heating by the several longer connectors is produced at the points of heat dissipation and does not have to be transferred through the semi-conductor pellets by the Peltier heat pumping. This type of circuitry also provides all identical pegs 52 at the cooling side.

The lower ends of certain of the semi-conductor pellets 43 are suitably interconnected in the pattern indicated in FIGURE 9A by relatively shorter prime surface pegs 80, shown in FIGURE 12. The prime surface pegs 80 have the same transversely elongated configuration as the pegs 52 and are formed of an inner rod 84 and an outer insulated sheath 86. These relatively shorter prime surface pegs have the upper end portions 88 of the rods thereof soldered or otherwise bonded directly to the lower ends of the pellets 43, as indicated at 90.

In the heat pump illustrated in FIGURE 9 heat is extracted from pegs 74, 80 and 92 by means of a cooling liquid circulated through the chamber 100, in which case pegs are exposed by conduits 102 and 104.

Power connections 106, 108 which connect to the bottom ends of corner pellets as seen in FIGURE 9A, are connected to single peg units 92, as best seen in FIGURE 11.

As previously described, with this arrangement it will be observed that all cross flow electrical connectors occur on the bottom ends of the pellets, or in other words, at the hot side thereof. This arrangement is provided deliberately so that the additional Joule heating caused by the slightly increased connector length does not appear at the cold junction and necessitate being "pumped" through the pellets by the Peltier effect. This also simplifies construction in that only three different types of peg units are required.

With the foregoing description it will be observed that the arrangement provides for removal of heat from the lower or hot junction of the pegs by a continuous flow of cooling water in heat transfer relationship to the prime surface pegs 72 and 80. Additional heat transfer surface may be added to the prime surface of pegs 72 and 80 if so desired by the identical methods employed on the cool side heat pegs 52. This tends to remove the heat generated in the unit both by the Peltier and the Joule effect and permits the heat absorption at the upper or cold junctions of the semi-conductor pellets to be at a maximum efficiency. Electric terminals for the unit are designated 106 and 108 respectively.

Referring now to FIGURE 14 there is illustrated an arrangement for use in an air cooling application. In this case the semi-conductor module is indicated at 110 as disposed in a vertical plane and connected to the ends of the semi-conductor pellets as in embodiments of the invention previously described, are a multiplicity of heat flow pegs 112, the sheaths 114 of which are connected in heat conducting relation to parallel fin plate structure 116. With this arrangement the fin plates are vertical and condensate will inherently drain off the heat transfer structure.

Figure 7:
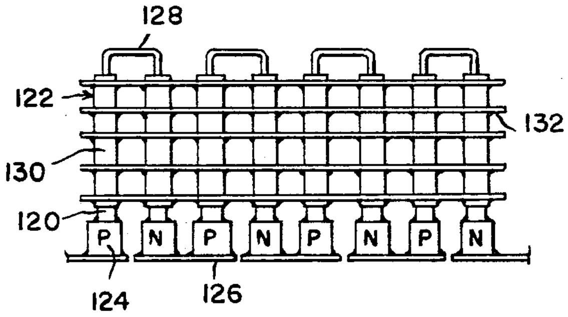
FIGURE 7 is a side elevation of a modified heat exchange assembly employing the improved peg-type heat exchanger.

A somewhat different embodiment of the invention is illustrated in FIGURE 7 where the lower ends 120 of the inner rod portion of the peg units 122 are soldered or otherwise bonded directly to the upper surfaces of the semi-conductor pellets 124. The lower ends of alternate pairs of pellets are interconnected by conducting straps 126. In the present case however, the series electrical circuit through the pellets is completed through the peg units by external circuitry, such for example as the insulated electrical conductors 128 which are connected to the upper ends of the inner rods of the peg units. As before, the peg sheaths 130 are insulated from the rods preferably by a suitable metal oxide so that the sheaths 130 and fin plates 132 remain at ground potential.

While the peg elements are illustrated throughout as formed of solid bar or rod stock, they may in some cases be formed of relatively thick walled tubing so as to conserve metal.

The use of the peg-type heat exchanger eliminates the flat plate of the heat-sink which has previously been considered necessary. Not only does this represent a substantial savings in material, but it also eliminates the extremely accurate machining formerly required to produce efficient heat transfer from the junctions of the semi-conductor pellets to the plate of the heat-sink.

The present construction is characterized by the relatively large cross-sectional area of the electrical insulating material such as aluminum oxide, through which the heat flux must pass, and this in turn results in a considerable reduction in the temperature differential across this thermal barrier. The present construction also provides for any desirable fin spacing together with any useful form of corrugation of the fin plate.

The principal advantages in employing the single oval or transversely elongated peg in place of the copper conducting strap and two round pegs per junction are that two solder joints per junction are eliminated; thermal barriers represented by the additional two joints are eliminated; the resistance of the connector is reduced because of the far greater cross-sectional area in the direction of current flow of the oval peg connector over the standard relatively thin connector conventionally used; and the cross-sectional area of the oval peg in the direction of heat flow is greater than that for two individual round pegs, thereby increasing thermal conductance. Secondly, for a high temperature differential where it is desirable to employ a substantial amount of insulation, the present construction permits the use of additional insulating material without increasing the length of the pellet assembly simply by locating the fin sheath nearest to the pellet at whatever distance is required to provide room for the desired amount of insulation.

The present invention permits employing a pair of units in back-to-back relation. Thus for example, the corresponding heat transfer pegs may be interspersed with each other and extend into a common passage through which air or cooling water may circulate.

The peg-type construction is also particularly useful at the hot junction for cooling since it permits the pegs to be immersed in cooling water without difficulty because of the insulation provided between the sheath and the inner rod portion of the peg.

The drawings and the foregoing specification constitute a description of the improved peg-type heat exchangers for thermoelectric devices and the method of making the same in such full, clear, concise and exact terms as to enable any person skilled in the art to practice the invention, the scope of which is indicated by the appended claims.

What I claim as my invention is:

1. A peg-type heat exchanger comprising a multiplicity of parallel peg units, each unit comprising a metal rod, a film of electrically insulating, heat conducting material on the sides of said rod, a metal sheath laterally surrounding said rod, electrically insulated therefrom by said film, and in good heat transfer relation to said film, the sheaths at the corresponding ends of all of said units exposing the ends of the rods to permit bonding of the rod ends to an electrical conductor or thermoelectric material without making a connection to the sheath, and a plurality of fin plates each having openings through which said peg units extend and including portions connected in good heat conducting relation to the sheaths of said peg units.

2. A heat exchanger as defined in claim 1 in which said film is a metal oxide.

3. A heat exchanger as defined in claim 1 in which said rod is aluminum, and said film is a hard anodized layer of aluminum oxide.

4. A heat exchanger as defined in claim 1 in which the sheaths at corresponding ends of all of said units expose the ends of said rods by terminating slightly short of the ends thereof.

5. A thermoelectric heat pump unit comprising a flat module having a multiplicity of semi-conductor pellets, means electrically connecting said pellets in series, said pellets being arranged with thermally similar ends at the same side of said module, heat flow pegs comprising metal rods and metal sheaths laterally surrounding said rods and electrically insulated from said rods, thin electrically insulating, heat conducting films in full area contact with and intermediate said rods and sheaths, said rods being bonded in both electrical and heat conducting relation to the semi-conductor pellets, and heat transfer fins connected to said metal sheaths.

6. A unit as defined in claim 5 in which said fins are formed by a multiplicity of plates disposed in general parallelism, said plates having aligned apertures for the reception of said pegs.

7. A thermoelectric heat pump unit comprising a flat module having a multiplicity of semi-conductor pellets being arranged in a block of transversely and longitudinally aligned rows with thermally similar ends of the pellets at the same side of the module, heat flow pegs comprising inner metal rod portions and outer metal sheath portions laterally surrounding said rod portions, heat transfer fins on said sheath portions, a continuous layer of electrically insulating, heat conducting material interposed between the rod portions and sheath portions and in good heat transfer relationship thereto and constituting electrical insulating means therebetween, some of said rod portions being transversely elongated so as to have ends of the rod portions thereof shaped to cover the end surfaces of pairs of adjacent semi-conductor pellets and bonded thereto, said rod portions constituting electrical conductors between the pellets of said pairs and also constituting heat conductors for conveying heat between said pellets and said fins.

8. A unit as defined in claim 7 in which said fins comprise plates each of which is connected in heat transfer relation to substantially all of said sheaths.

9. A thermoelectric heat pump unit comprising a flat module having a multiplicity of semi-conductor pellets, said pellets being arranged with the thermally similar ends thereof at the same side of said module, a multiplicity of heat flow pegs, each of said pegs comprising an inner metal rod and outer metal sheath and an electrically insulating heat conducting material interposed directly between said rod and sheath, the rods of said pegs being secured directly in good heat and electric conducting relation to the ends of said pellets at one side of said module, electrically conducting means connecting the outer ends of the rods of adjacent pellets in pairs, electrically conducting means connecting pairs of pellets at the opposite ends thereof so as to provide a continuous electrical series connection between all of said pellets.

10. A thermoelectric heat pump unit comprising a flat module having a multiplicity of semi-conductor pellets arranged in longitudinally extending closely spaced parallel rows, the number of pellets in each of said rows being an even number, said pellets being arranged with the thermally similar ends thereof at the same side of said module, heat flow pegs interconnecting the pellets of consecutive pairs thereof in the longitudinally extending rows, each of said heat pegs comprising an inner electrically and thermally conducting rod transversely elongated and connected to corresponding ends of two adjacent pellets in good thermally and electrically conducting relationship, said heat flow pegs being connected to the cold terminals of said pellets and extending into the path of air to be cooled thereby, prime surface heat pegs connected to the opposite ends of adjacent pairs of pellets in each longitudinally extending row and arranged to provide with the first mentioned heat flow pegs a continuous series electrical path through all of the pellets of each of said longitudinally extending rows, said prime surface pegs including inner transversely elongated thermally and electrically conducting rods connected in good electrical and thermal conducting relation to the ends of the two pellets which they interconnect, said last mentioned rods being connected to the hot terminals of said pellets, cross connector heat peg units connecting the end pellets of each row of pellets to the end pellet of one adjacent row of pellets so as to provide a continuous series electrical connection through the entire assembly of pellets, said cross connector heat peg units comprising conductor straps adapted to connect the adjacent end surfaces of pellets at the ends of adjacent longitudinal rows so as to provide an electrical connection therebetween, and comprising further separate heat transfer pegs including metal rods in good heat transfer relationship to said straps adjacent the ends thereof and shaped and disposed to be positioned in alignment with the aforesaid prime surface heat pegs, all of said pegs comprising metal rods and insulated metal sheaths overlying said rods, said prime surface heat transfer pegs and the heat transfer pegs of said cross connector heat peg units being connected to the hot terminals of said pellets and extending into a heat transfer chamber, and means for circulating cooling water through said chamber.

11. A thermoelectric heat pump unit comprising a flat module having a multiplicity of semi-conductor pellets arranged in longitudinally extending closely spaced parallel rows with the thermally similar ends thereof at the same side of said module, heat flow pegs interconnecting the pellets of consecutive pairs in each row, each of said heat pegs comprising an inner electrically and thermally conducting metal rod having a length greater than its maximum width and transversely elongated to overlie the ends of two adjacent pellets and having the inner end thereof connected in good thermally and electrically conducting relationship to the ends of two adjacent pellets, said pegs being thus disposed with their maximum width dimension extending along one of the rows of pellets, leaving the space between adjacent rows of pegs clear, means electrically connecting the opposite ends of adjacent pellets in adjacent pairs of pellets comprising means at the opposite side of said module, or strap-type conductors where provided at the same side of said module as said pegs to leave the space between adjacent rows of pegs unobstructed.

12. A unit as defined in claim 11, comprising plate type heat exchange fins each electrically insulated from all of said pegs and in good heat conducting relation to substantially all of said pegs.

13. A pair of heat flow pegs for use with a thermoelectric heat pump comprising a plurality of pellets of semi-conducting material, each of said pegs comprising an elongated metal element, a metal sheath laterally surrounding said element and electrically insulated therefrom, the insulation being provided by a continuous layer of an electrically insulating, heat conducting material in good heat conducting relation to both of said element and said sheath, one end of each of said elements being exposed by the sheath associated therewith to provide for bonding each of said elements to at least one of the pellets without contact between said sheath and the pellet, and metallic heat exchange means connecting said pegs.

14. Structure as defined in claim 13 in which the exposed ends of said elements extend longitudinally beyond the sheath associated therewith.

15. Structure as defined in claim 13 in which said heat